United States Patent
Sakamoto et al.

(10) Patent No.: US 6,385,025 B2
(45) Date of Patent: *May 7, 2002

(54) INSULATED GATE TYPE SEMICONDUCTOR APPARATUS WITH A CONTROL CIRCUIT

(75) Inventors: Kozo Sakamoto, Takasaki; Isao Yoshida, Nishitama-gun, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/797,983

(22) Filed: Mar. 5, 2001

Related U.S. Application Data

(63) Continuation of application No. 09/489,736, filed on Jan. 21, 2000, now Pat. No. 6,201,677, which is a continuation of application No. 08/998,644, filed on Dec. 29, 1997, now Pat. No. 6,057,998.

(30) Foreign Application Priority Data

Dec. 25, 1996 (JP) ............................................. 8-344993

(51) Int. Cl.[7] ................................................. H02H 3/00
(52) U.S. Cl. ........................ 361/93.8; 361/100; 361/115
(58) Field of Search ................................. 361/93.1, 100, 361/115, 93.8, 23, 24, 25

(56) References Cited

U.S. PATENT DOCUMENTS

| | | | |
|---|---|---|---|
| 5,200,879 A | 4/1993 | Sasagawa et al. | ......... 361/93.1 |
| 5,383,082 A | 1/1995 | Nishizawa | ................. 361/93.1 |
| 6,201,677 B1 * | 3/2001 | Sakamoto et al. | ......... 361/93.1 |

FOREIGN PATENT DOCUMENTS

| | | | |
|---|---|---|---|
| JP | 6-244414 | 9/1994 | ......... H01L/29/784 |
| JP | 7-58293 | 3/1995 | ........... H01L/27/04 |
| JP | 9-139633 | 5/1997 | ............. H03F/1/52 |

* cited by examiner

Primary Examiner—Stephen W. Jackson
(74) Attorney, Agent, or Firm—Antonelli, Terry, Stout & Kraus, LLP

(57) ABSTRACT

A semiconductor apparatus such as a power MOSFET, an IGBT, or the like is provided having therein a control circuit such as an over-heating protection circuit and an over-current protection circuit, which realizes both of high-speed operation and prevention of erroneous operation caused by a parasitic device. To prevent erroneous operation, the control circuit controls so that when the voltage of a gate terminal is positive relative to that of a source terminal, a first switch circuit is turned on, when the voltage of the gate terminal is negative relative to that of the source terminal, a second switch circuit is turned on, and when the gate terminal and the source terminal have an almost same potential and a drain terminal has a high potential, the second switch circuit is turned on, thereby reducing leakage current from the drain terminal to the gate terminal.

6 Claims, 16 Drawing Sheets

FIG. 3

INSULATED GATE TYPE SEMICONDUCTOR APPARATUS WITH A CONTROL CIRCUIT

CROSS-REFERENCE TO RELATED APPLICATIONS

This application is a continuation of application Ser. No. 09/489,736, filed on Jan. 21, 2000, now U.S. Pat. No. 6,201,677, which is a continuation of application Ser. No. 08/998,644, filed on Dec. 29, 1997 (now U.S. Pat. No. 6,057,998), the entire disclosures of which are hereby incorporated by reference.

BACKGROUND OF THE INVENTION

The present invention relates to an insulated gate type semiconductor apparatus such as a power MOSFET, an IGBT (Insulated Gate Bipolar Transistor), and the like. Particularly, the invention relates to methods of realizing high-speed operation, negative gate voltage protection and prevention of a breakdown voltage drop of an insulated gate type semiconductor apparatus having a control circuit which includes an over-heating protection circuit, an over-current protection circuit, and the like on the same chip.

A technique in which an over-heating protection circuit is mounted on the same chip for improving the reliability of a power MOSFET is disclosed in Japanese Patent Application Laid-Open (JP-A) No. 7-58293. According to the conventional technique, a gate resistor is connected between an outside gate terminal and an inside gate terminal and an MOSFET for the protection circuit is connected between the inside gate terminal and an outside source terminal. When the temperature of the chip rises to a specified temperature or higher, the MOSFET for the protection circuit is turned on and a gate current flows in the resister, thereby enabling the power MOSFET to be turned off before the power MOSFET is broken.

The conventional technique relates to a self-isolation-structured device in which a control circuit is formed in a drain region of the power MOSFET in order to suppress increase of the number of processing steps. Consequently, the costs are suppressed. However, there is a problem such that when the gate voltage becomes negative, a leakage current flows from an outside drain terminal to the outside gate terminal through a parasitic npn transistor existing between the drain of the MOSFET for the protection circuit and the drain of the power MOSFET. In the conventional technique, therefore, as a countermeasure against the problem, a diode for cutting off the base current of the parasitic npn transistor is connected in series to the MOSFET for the protection circuit and, further, a diode for preventing breakdown of the above diode is connected between the outside gate terminal and the outside source terminal.

Another technique using an MOSFET in place of the gate resistor to increase the frequency of a power MOSFET having therein an over-heating protection circuit is disclosed in JP-A-6-244414. According to the conventional technique, an MOSFET in which the potential of the body is fixed to a source terminal voltage is used in place of a gate resistor between the outside gate terminal and the inside gate terminal.

In the conventional semiconductor apparatus disclosed in the above-mentioned JP-A-7-58293, a negative gate voltage protection for preventing operation of the parasitic npn transistor when the source and the drain of the MOSFET for the protection circuit are not connected to the source terminal of the power MOSFET is not considered. The conventional technique also has problems such that the power MOSFET cannot be completely turned off due to the drop of the voltage of the diode since the diode is inserted between the gate terminal and the source terminal, and the minimum gate terminal voltage for normally operating control circuits such as the over-heating protection circuit and the like cannot be decreased.

Further, in the conventional technique using the MOSFET in place of the gate resistor to realize the high-speed operation disclosed in JP-A-6-244414, it is not described that the body potential is controlled to reduce the on-resistance.

SUMMARY OF THE INVENTION

It is, therefore, a first object of the invention to provide an insulated gate type semiconductor apparatus with a control circuit having an effect of negative gate voltage protection which prevents the operation of a parasitic npn transistor when both of the source and the drain of an MOSFET for a protection circuit are not connected to the source terminal of a power MOSFET.

A second object of the invention is to provide an insulated gate type semiconductor apparatus with a control circuit, which can operate at high speed.

A third object of the invention is to provide an insulated gate type semiconductor apparatus with a control circuit, in which even when the negative gate voltage protection is achieved and the speed of the operation is increased, a drain breakdown voltage of the power MOSFET and a collector breakdown voltage of the IGBT are not dropped.

A fourth object of the invention is to provide an insulated gate type semiconductor apparatus with a control circuit in which an operation margin of the gate voltage for normally operating a control circuit part is enlarged.

In order to achieve the objects, for example, as shown in FIGS. 1 and 2, an insulated gate type semiconductor apparatus with a control circuit according to the invention comprises: a first transistor (power MOSFET 30) including a first n-type impurity region (102) on a semiconductor substrate, a second p-type impurity region (107) in contact with the first impurity region, and a third n-type impurity region (109*a*) covered by the second impurity region (107); a fourth p-type impurity region (104*a*) in contact with the first impurity region; a second transistor (MOSFET 32) including fifth and sixth impurity regions (109*b*, 109*c*) of n-type covered by the fourth impurity region; a drain terminal 1 connected to the first impurity region; a gate terminal 2 connected to the fifth impurity region (109*b*) of the second transistor; a source terminal 3 connected to the third impurity region; a first switch circuit (SW2) provided between the gate terminal and the fourth impurity region; and a second switch (SW3) provided between the source terminal and the fourth impurity region. In the insulated gate type semiconductor apparatus with a control circuit constructed as mentioned above, when the voltage of the gate terminal is negative relative to that of the source terminal, the second switch circuit (SW3) is turned off and the first switch circuit (SW2) is turned on. When the voltage of the gate terminal is positive relative to that of the source terminal, the second switch circuit (SW3) is turned on and the first switch circuit (SW2) is turned off. When the voltages of the gate terminal 2 and the source terminal 3 are almost equal and the voltage of the drain terminal is larger than a predetermined positive voltage relative to the voltage of the source terminal, the second switch circuit (SW3) is turned off and the first switch circuit (SW2) is turned on.

Further, as a preferable construction, as shown in the diagram, a gate electrode of the first transistor is connected to the sixth impurity region (109c) and there are also provided a third switch circuit (SW1) between the gate electrode of the first transistor and the ground (6) to which the source terminal is connected and a protection circuit (21) for detecting an overload condition of the first transistor, turning on the third switch circuit, and increasing source-drain resistance of the second transistor.

Preferably, a gate electrode of the first transistor is connected to the sixth impurity region, and there are provided: a third switch circuit (SW1) provided between the gate electrode of the first transistor and the ground (6) connected to the fourth impurity region; and a protection circuit (21) for detecting an overload condition of the first transistor, turning on the third switch circuit, and increasing source-drain resistance of the second transistor.

It is preferable that the third switch circuit (SW1) has, for example as shown in FIG. 3, a third transistor (31) which is turned on by a signal indicating that the protection circuit detects an over-heating condition of the semiconductor apparatus and a fourth transistor (42) which is turned on by a signal indicating that the protection circuit detects an over-current condition of the drain current of the first transistor.

More preferably, first and second diodes (91, 89) whose anodes are connected to the gate of the first transistor are further provided, a source-drain path of the third transistor (31) is connected between the cathode of the first diode (91) and the ground (6), and a source-drain path of the fourth transistor (42) is connected between the cathode of the second diode (89) and the ground (6).

These above and further objects and features of the invention will be seen by reference to the description, taken in connection with the accompanying drawings.

BRIEF DESCRIPTION OF THE DRAWINGS

FIG. 3 is a circuit diagram of a semiconductor apparatus according to a second embodiment of the insulated gate type semiconductor apparatus with a control circuit of the invention;

DESCRIPTION OF THE PREFERRED EMBODIMENTS

The embodiments of the insulated gate type semiconductor apparatus with a control circuit according to the invention will be described in detail hereinbelow with reference to the attached drawings.

<Embodiment 1>

Figure 1:
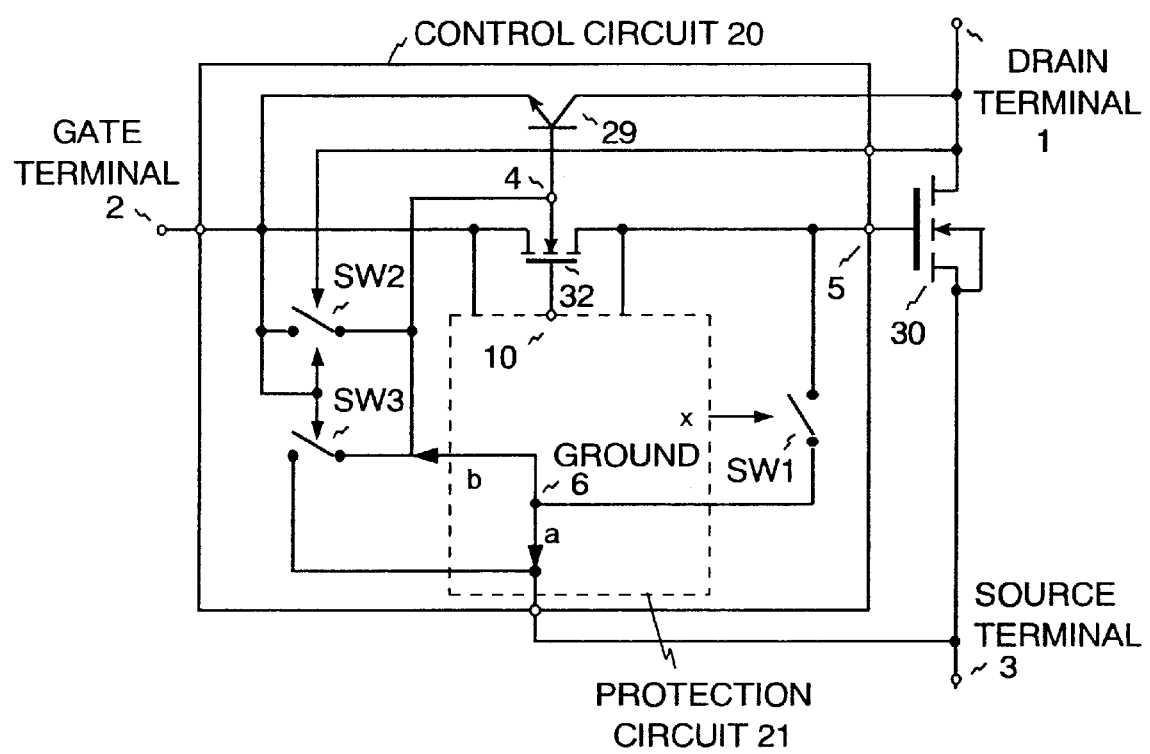
FIG. 1 is a block circuit diagram showing a first embodiment of an insulated gate type semiconductor apparatus with a control circuit according to the invention.

FIG. 1 is a block circuit diagram showing a first embodiment of a semiconductor apparatus according to the invention. The semiconductor apparatus having the circuit construction shown in FIG. 1 has a power MOSFET 30 and a protection circuit 21 on a single chip and is constructed so as to be seen as a single transistor from the outside of the chip. As outside terminals of the chip of the semiconductor apparatus, in a manner similar to an ordinary power MOSFET, a drain terminal 1, a gate terminal 2, and a source terminal 3 are provided.

In the semiconductor apparatus of the embodiment, the protection circuit 21 has therein a temperature detection circuit and an over-current detection circuit. There is further provided a switch circuit SW1 for forcedly turning off the power MOSFET 30 or regulating a drain current of the power MOSFET 30 under an overload condition such that a heavy current flows between the drain terminal 1 and the source terminal 3 even when a positive voltage is applied to the gate terminal 2.

An MOSFET 32 allows an input signal to be easily transmitted from the gate terminal 2 to the gate of the power MOSFET 30 by reducing on-resistance of the MOSFET 32 at the time of ordinary switching of the power MOSFET 30, thereby enabling high-speed switching to be realized. Under the overload condition, circuits for detecting over-heating or over-current provided in the protection circuit 21 operate so that the protection circuit operates so as to close the switch circuit SW1 in response to a signal (x). Consequently, the drain current of the power MOSFET 30 is cut off or regulated under the overload condition, so that the breakage of the device can be prevented The circuit has a feature that the on-resistance of the MOSFET 32 is increased by decreasing the voltage of a node 10 when the protection circuit 21 operates. When the protection circuit 21 operates to cut off or regulate the drain current of the power MOSFET 30, the gate current from the gate terminal 2 does not easily flow. As a result, charges in the gate of the power MOSFET 30 are discharged via the switch circuit SW1. In this case, even when the on-resistance of the switch circuit SW1 is high, since the MOSFET 32 reduces injection of the charges to the gate, the power MOSFET 30 can be turned off promptly. Since the gate current after the operation of the protection circuit can be also reduced, it is characterized in that power dissipation is small.

In the semiconductor apparatus, a control circuit 20 is formed by using ordinary power MOSFET process in order to reduce the process cost, which will be described hereinlater with reference to FIG. 2. Consequently, there is an advantage that the control circuit can be mounted at a low process cost. However, a parasitic npn transistor 29 in which a drain 102 of the power MOSFET 30 is used as a collector, a drain region 109b of the MOSFET 32 serving as an MOSFET for the control circuit is used as an emitter, and a body region 104a of the MOSFET 32 for the control circuit is used as a base is formed. When the voltage of the gate terminal 2 is negative, a forward voltage is applied to both of the drain region 109b of the MOSFET 32 connected to the gate terminal 2 and the body region 104a of the MOSFET 32. Consequently, the parasitic npn transistor 29 is turned on and a problem that the leakage current flows from the drain terminal 1 to the gate terminal 2 occurs.

According to the embodiment, in order to solve the problem of the parasitic npn transistor, a switch circuit SW2 for connecting (that is, short-circuiting) the body 4 of the MOSFET 32 and the gate terminal 2 and a switch circuit SW3 for connecting the body 4 of the MOSFET 32 and the source terminal 3 are provided.

When the voltage of the gate terminal 2 is positive relative to the voltage of the source terminal 3, it is controlled so that the switch circuit SW2 is "off" and the switch circuit SW3 is "on". Usually, when the voltage of the gate terminal 2 is positive, the power MOSFET 30 is turned on, the voltage of the drain terminal 1 against the source terminal 3 is dropped, and the voltage of the gate terminal 2 is larger than the voltage of the drain terminal 1. Therefore, when the switch circuit SW2 is kept to be "on", the forward bias is applied to the PN junction between the body 4 of the MOSFET 32 and the drain terminal 1. That is, the collector and the emitter of the parasitic npn transistor 29 are forward biased and the parasitic transistor 29 operates inversely. Consequently, a problem that the leakage current flows from the gate terminal 2 to the drain terminal 1 occurs. The switch circuit SW2 is therefore turned off and the switch circuit SW3 is turned on, thereby setting the potential of the body 4 of the MOSFET 32 to be equal to the potential of the source terminal 3. By controlling the switching circuits as mentioned above, the inverse operation of the parasitic npn transistor 29 can be prevented.

On the other hand, when the voltage of the gate terminal 2 is negative relative to the voltage of the source terminal 3, the switch circuit SW2 is turned on and the switch circuit SW3 is turned off. Consequently, the potential of the body 4 of the MOSFET 32 becomes equal to that of the gate terminal 2, thereby preventing the parasitic npn transistor 29 to be turned on. The embodiment is characterized in that, by controlling the switch circuits in this manner, the leakage current from the drain terminal 1 to the gate terminal 2 can be prevented.

The above countermeasure is disclosed in JP-A-9-139633 applied by the inventors of the present invention. However, a fact was newly found that since switching means disclosed in the publication corresponding to the switch circuits SW2 and SW3 of the embodiment operates by the voltage applied between the gate terminal 2 and the source terminal 3, when the voltages of the gate terminal 2 and the source terminal 3 are almost equal, the switching means (both of SW2 and SW3) are turned off or have a high impedance. That is, the base 4 of the parasitic npn transistor 29 is floated or has a high impedance. It is found that, when a high voltage is applied to the drain terminal 1 in a state where the voltages of the gate terminal 2 and the source terminal 3 are almost equal, the breakdown voltage of the parasitic npn transistor drops to a collector-to-emitter breakdown voltage BVceo (about 20 to 30V; the breakdown voltage when the base and the emitter are open) which is lower than the inherent drain breakdown voltage (about 70V) of the power MOSFET 30 or a value close to BVceo, and there is a risk that a heavy current flows from the drain terminal 1 to the gate terminal 2.

According to the invention, in order to prevent the drop of the breakdown voltage of the parasitic npn transistor 29 caused by the collector-to-emitter breakdown voltage BVceo, when the voltages of the gate terminal 2 and the source terminal 3 are almost equal and a positive drain voltage is applied to the drain terminal 1, the switch circuit SW2 is turned on with the drain voltage of about 10 to 20V including a margin in the breakdown voltage BVceo, which is lower than BVceo. By turning on the switch circuit SW2, the collector-to-emitter breakdown voltage of the parasitic npn transistor 29 becomes a collector-to-emitter breakdown voltage BVces (breakdown voltage when the base and the emitter are short-circuited) which is equal to a drain-to-source breakdown voltage of the power MOSFET 30. Thus, the drop of the drain breakdown voltage of the power MOSFET 30 can be prevented. Although the switch circuit SW2 is turned on with a drain voltage of about 10 to 20V when the positive drain voltage is applied in the embodiment, any voltage as long as it is smaller than the breakdown voltage BVceo can be theoretically used to turn on the switch circuit SW2.

In the embodiment, an intelligent power MOSFET in which the protection circuit for improving the reliability is provided by a low-cost process can operate at high speed. Further, the power MOSFET can be also provided with a negative gate voltage protection circuit for preventing the operation of a parasitic device when the gate voltage relative to the source voltage is negative. Further, there is a feature that the drain-to-source breakdown voltage of the power MOSFET does not drop even when the above functions are added.

Figure 2:
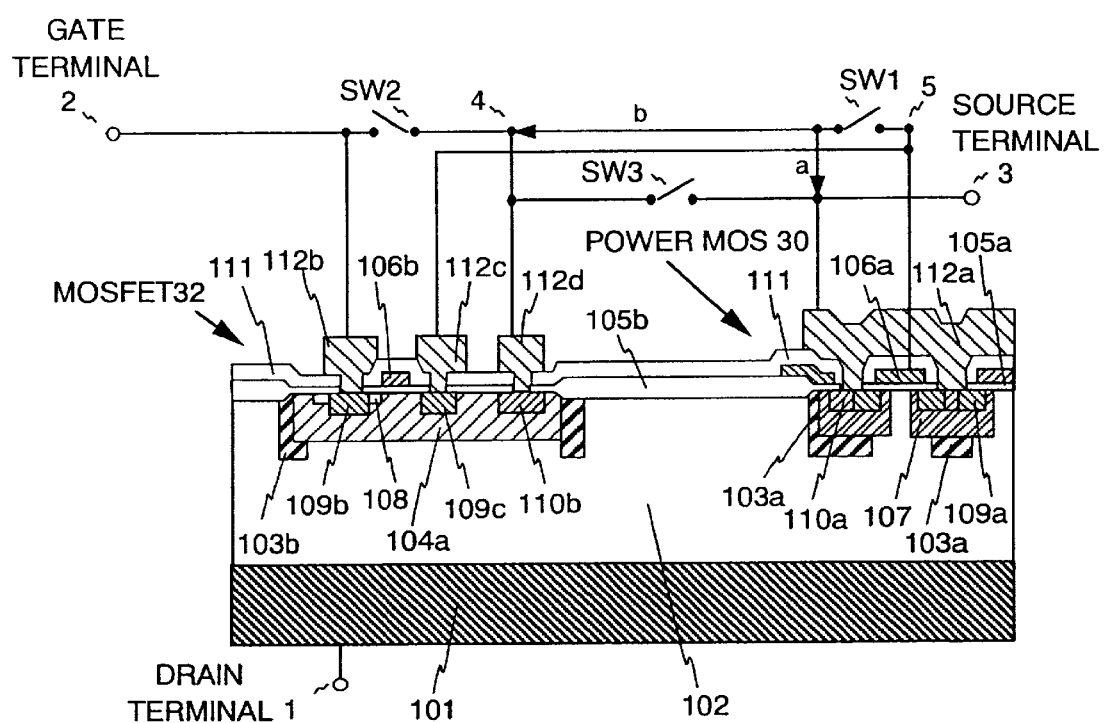
FIG. 2 is a cross section of the semiconductor apparatus according to the first embodiment shown in FIG. 1.

FIG. 2 is a cross section of the MOSFET 32 and the power MOSFET 30 shown in FIG. 1. As shown in FIG. 2, the n-type epitaxial layer 102 having resistivity of about 1 to 2 Ω·cm and the thickness of about 10 μm is formed on a high-density n-type semiconductor substrate 101 having resistivity of about 0.02 to 0.002 Ω·cm in which antimony or arsenic is included as an impurity.

In an area for forming the power MOSFET 30, there are provided a gate oxide film 105a having the thickness of about 50 nm and a polycrystalline silicon gate layer 106a formed on the film 105a. Between patterns of the polycrystalline silicon gate layer 106a, there are provided a first p-type well diffusion layer 103a having the depth of about 6 μm and a dose of about $10^{15}$ cm$^{-2}$, a p-type diffusion layer 107 for the body having the depth of about 2 μm and the dose of about $5\times10^{13}$ cm$^{-2}$ formed in a self-aligned manner by using the polycrystalline silicon gate layer 106a as a mask, and an n-type diffusion layer 109a for the source having the depth of about 0.4 μm and the dose of about $10^{16}$ cm$^{-2}$. A high-density p-type diffusion layer 110a having the depth of about 0.5 μm and the dose of about $10^{15\ cm-2}$ is also formed in order to obtain ohmic contacts between the body 107 and an aluminum electrode 112a. The aluminum electrode layer 112a serving as a source electrode is formed on the polycrystalline silicon gate layer 106a via an insulating layer 111.

In an area for forming the MOSFET 32, there are provided: a second p-type well impurity layer 104a which serves as a body and has the depth of about 5 μm and the dose of about $2\times10^{13}$ cm$^{-2}$; a high-density n-type impurity layer 109b and a high-density n-type diffusion layer 109c formed in the same step as the n-type diffusion layer 109a, serving as a drain impurity layer and a source impurity layer, respectively; and a high-density p-type impurity layer 110b formed in the same step of the p-type diffusion layer 110a. A polycrystalline silicon gate layer 106b formed in the same step as the polycrystalline silicon gate layer 106a is used as a gate electrode of the MOSFET 32 for the protection circuit and a low-density n-type offset region 108 of the dose of about $5\times10^{12}$ cm$^{-2}$ for increasing the drain breakdown voltage is further provided.

Aluminum electrode layers 112b, 112c, and 112d serve as a drain electrode, a source electrode, and a body electrode of the MOSFET 32, respectively. A reference number 105b denotes a field oxide film having the thickness of about 1 μm formed by selective oxidation.

The semiconductor apparatus has a self-isolation structure in which the MOSFET for the protection circuit such as the MOSFET 32 is formed in the n-type epitaxial layer 102 as a drain region of the power MOSFET 30 by using ordinary power MOSFET processing to reduce the processing cost. Consequently, there is an advantage that the control circuit can be mounted at low cost in a manner similar to conventional power MOSFET processing. As shown in FIG. 1, however, the parasitic transistor 29 in which the drain terminal 1 of the power MOSFET is used as a collector, the drain region 109b of the MOSFET 32 is used as an emitter, and the body region 104a of the MOSFET 32 is used as a base is formed. According to the semiconductor apparatus of the invention, as described above with reference to FIG. 1, the operation of the parasitic transistor 29 can be prevented by controlling the voltage of the body 4 of the MOSFET 32 with the switch circuits SW2 and SW3.

<Embodiment 2>

Figure 3:
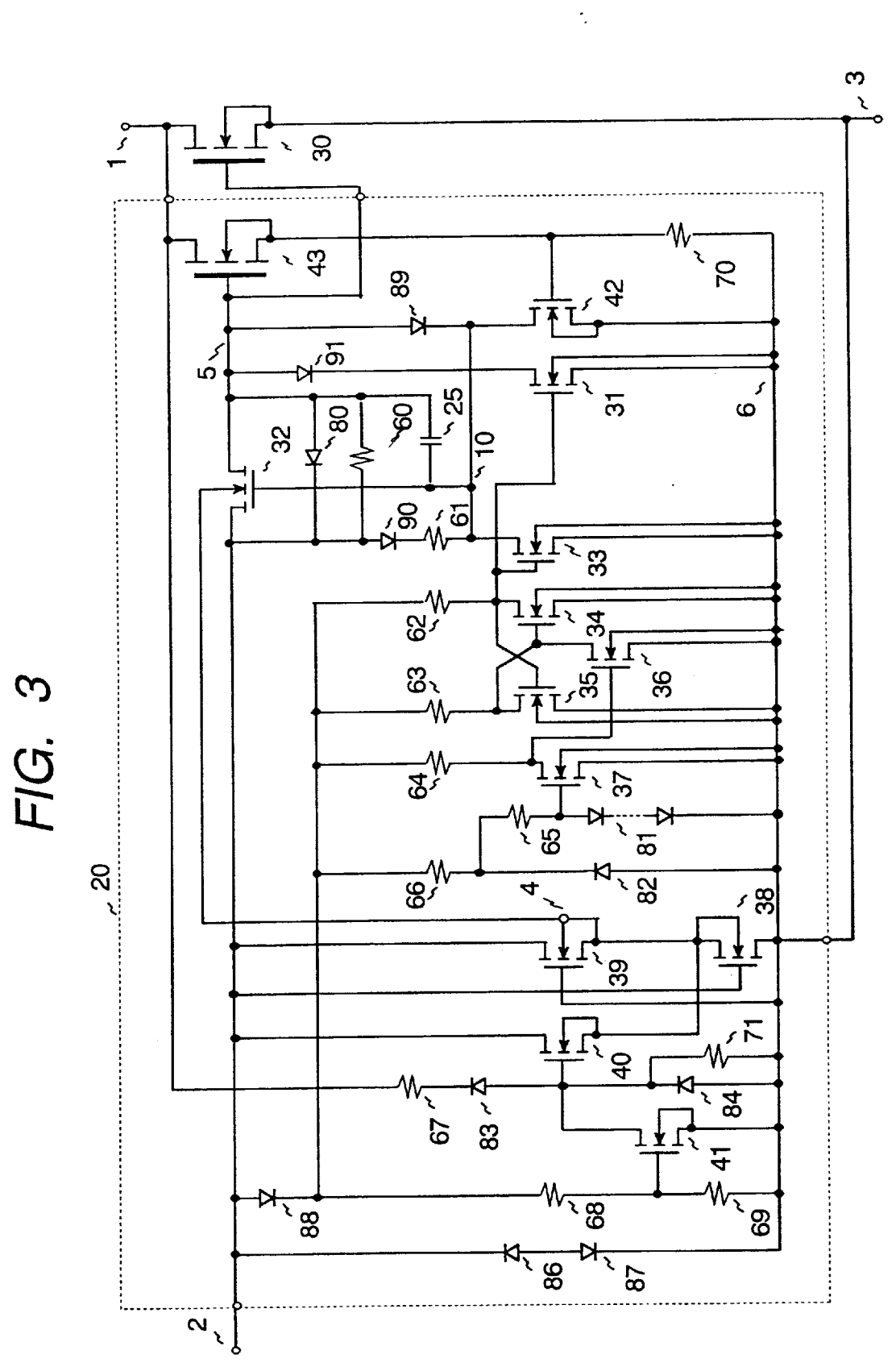

FIG. 3 is a circuit diagram showing a second embodiment of the semiconductor apparatus according to the invention. The embodiment corresponds to a case where the source terminal 3 is connected to the ground 6 shown in FIG. 1 (connection a). The switch circuits SW1 to SW3 are shown with a specific circuit construction. In the embodiment, an over-heating protection circuit and an over-current protection circuit are provided as the protection circuit 21.

That is, the switch circuit SW1 is provided to connect and disconnect the internal gate 5 of the power MOSFET 30 and the source terminal 3 so that the power MOSFET 30 is not broken under the overload condition and is constructed by an MOSFET 31 for the over-heating protection and an MOSFET 42 for the over-current protection. The switch circuit SW2 connects and disconnects the gate terminal 2 and the body 4 of the MOSFET 32 and is constructed by an MOSFET 39 which is turned on when the voltage of the gate terminal 2 is negative relative to that of the source terminal 3 and an MOSFET 40 which is turned on when the potential of the drain terminal 1 is larger than that of the source terminal 3 by 10 to 20 V or larger in a state where the potential of the gate terminal 2 is almost equal to that of the source terminal 3. The switch circuit SW3 is constructed by an MOSFET 38 which connects and disconnects the source terminal 3 and the body 4 of the MOSFET 32.

When the power MOSFET 30 is turned on by applying the positive gate voltage of about 5 to 10V to the gate terminal at a room temperature, MOSFETs 31, 33, 42, 35, 36, 39, and 40 are "off" and MOSFETs 34, 37, 38, and 41 are "on" by the following reason. A resistor 66 and a diode 82 construct a constant voltage circuit and a constant voltage of about 3V is applied to the cathode of the diode 82. In the room temperature state, a voltage of 1.5V or higher is applied to the gate of the MOSFET 37 as a partial voltage from a line of a resistor 65 and a diode 81, so that the MOSFET 37 is in the "on" state and the MOSFET 36 is in the "off" state. In a latch circuit constructed by resistors 62, 63 and the MOSFETs 34, 35, since the value of the resistor 62 is set larger than the value of the resistor 63 by about one digit, when the positive voltage of the gate terminal 2 is applied, the MOSFET 34 is always "on" and the MOSFET 35 is "off". Consequently, the MOSFETs 31 and 33 are in the "off" state. When the voltage is applied to the gate terminal 2, the current flows from the gate terminal 2 to a diode 90 and a resistor 61, the MOSFET 32 is turned on, charges are supplied to the gate of the power MOSFET 30, and the power MOSFET 30 is turned on promptly. A resistor 60 is provided to reduce the difference between the potentials of the gate terminal 2 and an internal gate terminal 5 in a stationary state. A capacitor 25 is used to increase the gate voltage of the MOSFET 32 at higher speed by bootstrapping effect when the voltage of the gate terminal 2 is increased.

When the gate terminal 2 has the zero voltage to turn off the power MOSFET 30, since the gate charges of the power MOSFET 30 can be discharged through not only the MOSFET 32 but also through a diode 80, the power MOSFET 30 can be promptly turned off.

The over-current protecting operation is performed as follows. When the drain current increases, the drain current of a MOSFET 43 for current sensing which monitors the drain current of the power MOSFET 30 increases. Consequently, the voltage drop in a resistor 70 is accelerated and the MOSFET 42 starts to be turned on. The MOSFET 32 has therefore a high impedance, thereby reducing the voltage of the internal gate 5 of the power MOSFET 30 (the resistance of the switch circuit SW1 is reduced). Thus, the drain current of the power MOSFET 30 is prevented from becoming excessive.

The over-heat protecting operation is performed as follows. When the temperature of the chip rises to a specific temperature or higher, since the forward voltage of the diode line 81 is dropped due to the increase in temperature, the gate voltage of the MOSFET 37 decreases and the MOSFET 37 is turned off. The MOSFET 36 is consequently turned on and the state of the latch circuit constructed by the MOSFETs 34, 35 and the resistors 62, 63 is reversed. The MOSFET 34 is turned off and the MOSFET 33 is turned on, thereby dropping the voltage of the internal gate 5 of the power MOSFET 30 (the resistance of the switch circuit SW1 is reduced). Thus, the power MOSFET 30 is turned off.

The embodiment is characterized in that the over-current protection and the over-heating protection act and the voltage of the gate 10 of the MOSFET 32 is dropped to increase the on-resistance of the MOSFET 32 even when the voltage of the internal gate 5 of the power MOSFET 30 is dropped. Consequently, there is an effect such that the protection circuit can operate at high speed without reducing the on-resistance of the switch circuit SW1 so much, which is provided to cut off or regulate the drain current of the power MOSFET 30 like the MOSFET 31 or MOSFET 42. There is also an effect that it is unnecessary to flow an excessive gate current.

According to the embodiment, with respect to the MOSFETs with the sources connected to the source terminal 3, that is, the MOSFET 31, MOSFET 42, the MOSFETs 33 to 37, by using the method disclosed in JP-A-7-58293, that is, by using diodes 91, 89, 90, and 88, the operation of the parasitic npn transistors existing between the drains of the MOSFETs whose sources are connected to the source terminal 3 and the drain of the power MOSFET 30 are prevented, thereby achieving the negative gate voltage protection.

For prevention of the operation of the parasitic npn transistor of the MOSFET 32 whose source is not connected to the source terminal 3, the MOSFETs 39, 40, and 38 are used. That is, when the voltage of the external gate terminal 2 is negative, the MOSFETs 39 and 40 constructing the switch circuit SW2 are turned on and the MOSFET 38 constructing the switch circuit SW3 is turned off. The body voltage 4 of the MOSFET 32 has consequently the same potential as that of the gate terminal voltage 2, so that the base and emitter in the parasitic npn transistor 29 shown in FIG. 1 are prevented from being forward biased. The embodiment has an effect such that even when the MOSFET 32 is provided therein for the high speed operation, the leakage current from the drain terminal 1 to the gate terminal 2 can be cut off by the negative gate voltage protection.

Further, in the embodiment, when the threshold value of each of the MOSFETs 39, 38, and 40 is set to, for example, 1V, in a range where the voltage of the gate terminal 2 is within ±1V, all of the MOSFETs 38, 39, and 40 are turned off. When the voltage of the gate terminal 2 is close to zero, the base of the parasitic npn transistor 29 described with reference to FIG. 1 is opened or almost opened. Consequently, it is feared that the collector-to-emitter breakdown voltage of the parasitic npn transistor 29 drops to a value near the breakdown voltage BVceo (about 20 to 30V) when the base is open, not to the breakdown voltage BVces (about 70V) when the base and emitter are short-circuited.

In the embodiment, the circuit is constructed so that the gate terminal 2 and the body 4 of the MOSFET 32 are short-circuited when the potential of the drain terminal 1 is higher than that of the source terminal 3 and the MOSFET 40 constructing the switch circuit SW2 is turned on. Thus, there is an effect such that the collector-to-emitter breakdown voltage of the parasitic npn transistor 29 is returned to the breakdown voltage BVces when the base and emitter are short-circuited (about 70V which is equal to the drain-to-source breakdown voltage of the power MOSFET 30) and the drop of the drain breakdown voltage can be prevented.

When the breakdown voltage of each of diodes 83 and 84 is set to 10V and a resistor of 400 kΩ or larger is used as a resistor 67 and a resistor of about 1MΩ is used as a resistor 71, the drain leakage current flowing through the resistor 67 is cut off until the drain voltage is about 20V and is suppressed to a value 100 μA (=(60V−2×10V)/400 kΩ) or lower when the drain voltage is 60V. The diode 84 also operates to protect the gate of the MOSFET 40.

In the embodiment as well, as described in the first embodiment, the high-speed operation of the intelligent power MOSFET in which the protection circuit for improving the reliability is provided by the low-cost process can be realized. Further, the negative gate voltage protection for preventing the operation of the parasitic device even when the gate voltage relative to the source voltage is negative can be provided. It is characterized in that even when the function is added, the drain-to-source breakdown voltage of the power MOSFET does not decrease. It is desirable that the diodes and resistors used in the embodiment are formed by using the polycrystalline silicon layer for the gate of the MOSFET so that the parasitic device is not formed.

<Embodiment 3>

Figure 4:
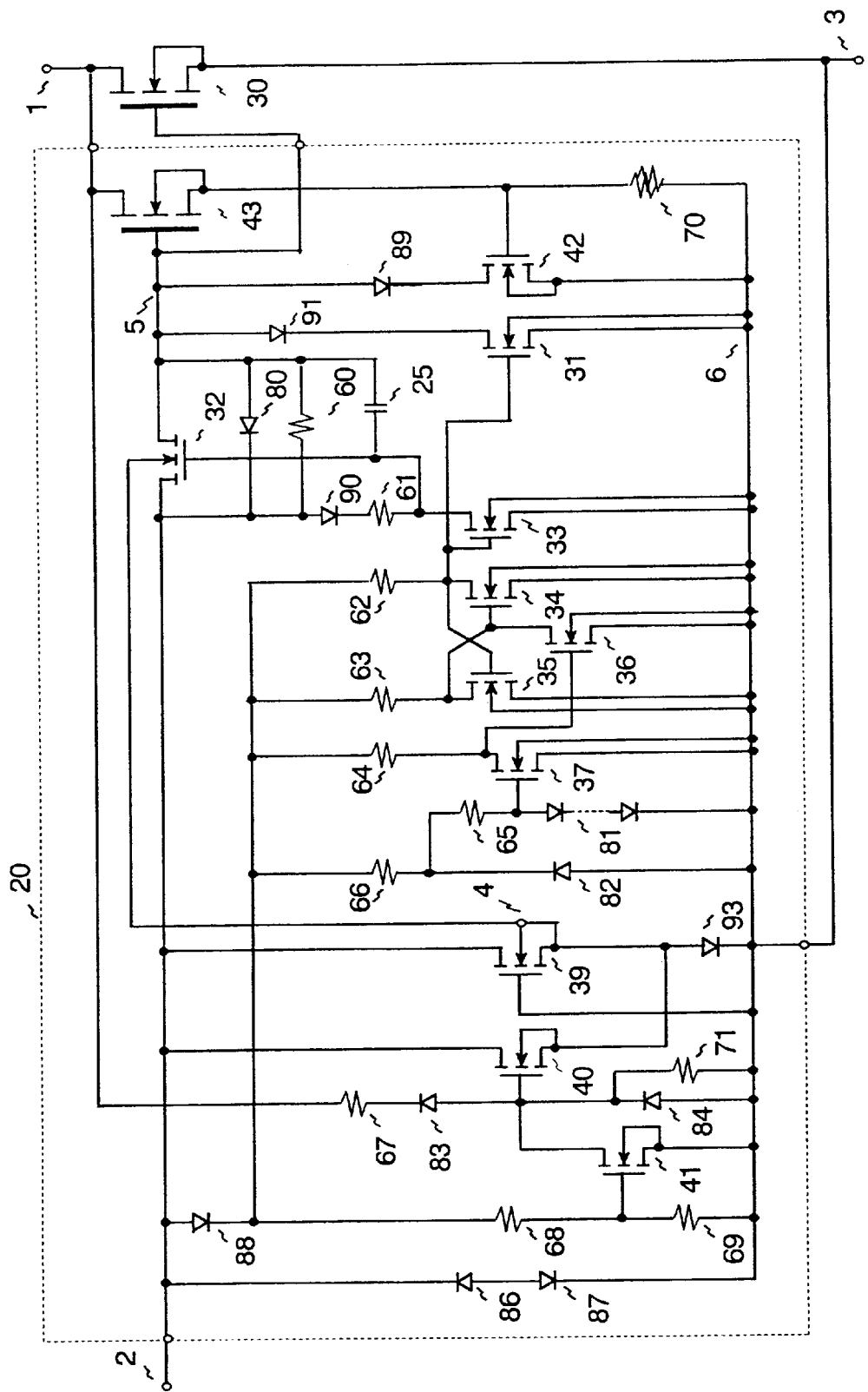
FIG. 4 is a circuit diagram showing a third embodiment of the insulated gate type semiconductor apparatus with a control circuit of the invention.

FIG. 4 is a circuit diagram showing a third embodiment of the semiconductor apparatus according to the invention. The embodiment also corresponds to a case where the source terminal 3 is connected to the ground 6 shown in FIG. 1 (connection a). The switch circuits SW1 to SW3 are shown by a specific circuit construction.

In the embodiment, a diode 93 is used in place of the MOSFET 38 which is used as the switch circuit SW3 in FIG. 3. The third embodiment is different from the second embodiment with respect to only a point that the difference between the voltage of the body 4 of the MOSFET 32 and that of the source terminal 3 is apt to be larger as compared with the case of using the MOSFET 38 since when the voltage of the gate terminal 2 is positive, the voltage of the body 4 of the MOSFET 32 is almost equal to the voltage of the source terminal 3 via the diode 93. Consequently, by using the low-cost processing as described in the first and second embodiments, the high-speed operation, the negative gate voltage protection, and the prevention of drop of the drain breakdown voltage can be achieved.

<Embodiment 4>

Figure 5:
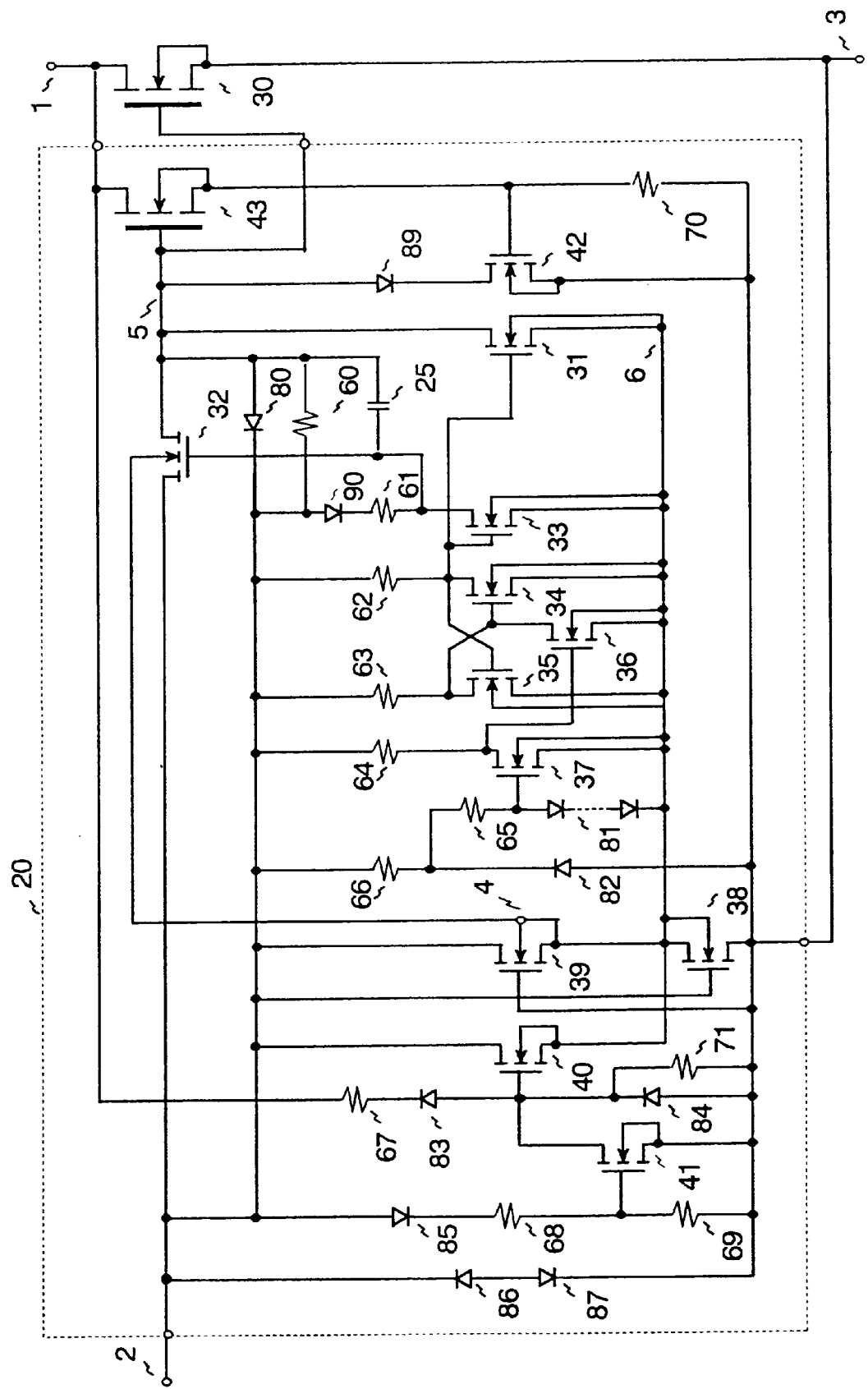
FIG. 5 is a circuit diagram showing a fourth embodiment of the insulated gate type semiconductor apparatus with a control circuit of the invention.

FIG. 5 is a circuit diagram showing a fourth embodiment of the semiconductor apparatus according to the invention. The embodiment corresponds to a case where the body 4 of the MOSFET 32 is connected to the ground 6 shown in FIG. 1 (connection b).

In the embodiment, the negative gate voltage protection is achieved by a method using the MOSFET 38 constructing the switch circuit SW3, in the similar method for the MOSFET 32, without using the diodes 88, 91 for negative gate voltage protection which are used to prevent the operation of the parasitic npn transistor existing in the MOSFETs 31, and 33 to 37 shown in FIG. 3. The diode 90 is also used in the embodiment in order to promptly increase the voltage of the gate of the MOSFET 32 by the bootstrapping effect by the capacitor 25 at the time of ordinary "on" operation of the power MOSFET 30. Therefore, when the bootstrapping effect is not expected, the diode 90 and the capacitor 25 are not necessary.

In the embodiment, not only the effects of the high-speed operation, the negative gate voltage protection, and the prevention of the drain breakdown voltage drop described in the first and second embodiments can be obtained, but also the voltage between the drain and the source of the MOSFET 38 can be reduced lower than the voltage between the anode and the cathode of each of the diodes 88, 91 for the negative gate voltage protection used in FIGS. 1 to 4 by using a low on-resistive device as the MOSFET 38. Consequently, even when the voltage of the gate terminal 2 drops by an amount corresponding to the above voltage difference, the over-heating protection circuit using the MOSFETs 33 to 37 can normally operate. That is, there is an effect that the operation margin of the gate voltage can be enlarged. Further, since the voltage of the internal gate terminal 5 after the operation of the over-heating protection circuit can be reduced as compared with the conventional technique, there is also an effect that the drain current can decrease. It is obviously understood that the fourth embodiment also has the effects of the high-speed operation, the gate voltage protection, and the prevention of the drain breakdown voltage drop described in the first and second embodiments.

<Embodiment 5>

Figure 6:
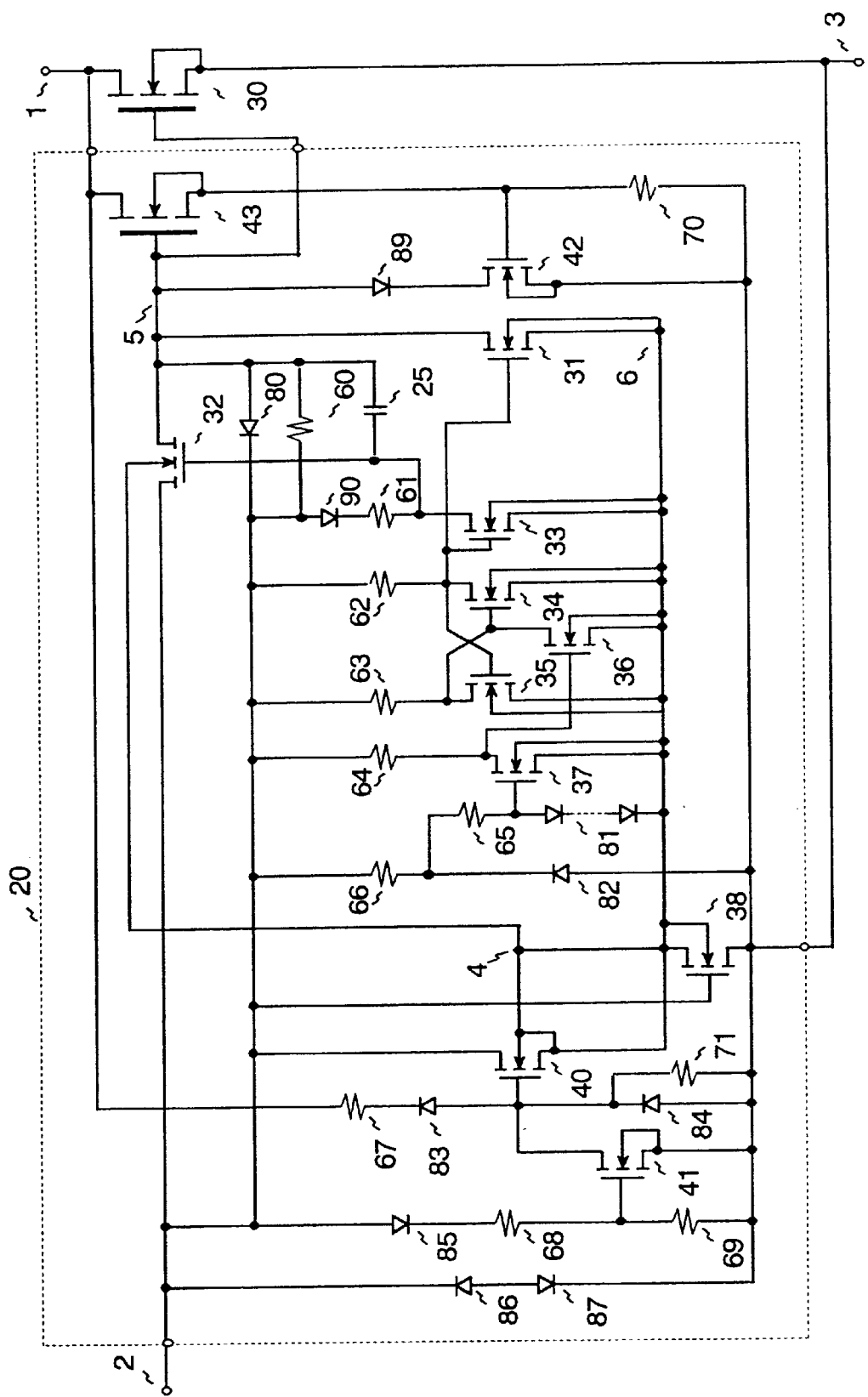
FIG. 6 is a circuit diagram showing a fifth embodiment of the insulated gate type semiconductor apparatus with a control circuit of the invention.

FIG. 6 is a circuit diagram showing a fifth embodiment of the semiconductor apparatus according to the invention. The embodiment also corresponds to a case where the body 4 of the MOSFET 32 is connected to the ground 6 shown in FIG. 1 (connection b). The switch circuits SW1 to SW3 are shown in a specific circuit construction.

Although the switch circuit SW2 is constructed by the MOSFETs 39 and 40 in the fourth embodiment shown in FIG. 5, the fifth embodiment relates to a case where the switch circuit SW2 is constructed by only the MOSFET 40. In the fifth embodiment, although the negative gate voltage protection ability is lower than that of the fourth embodiment, since the MOSFET 39 shown in FIG. 5 is unnecessary, there is an effect that an occupied area of the protection circuit on the semiconductor chip can be reduced. It is obviously understood that the fifth embodiment also has the effects of the high-speed operation, the negative gate voltage protection, and the prevention of the drain breakdown voltage drop described in the first and second embodiments.

<Embodiment 6>

Figure 7:
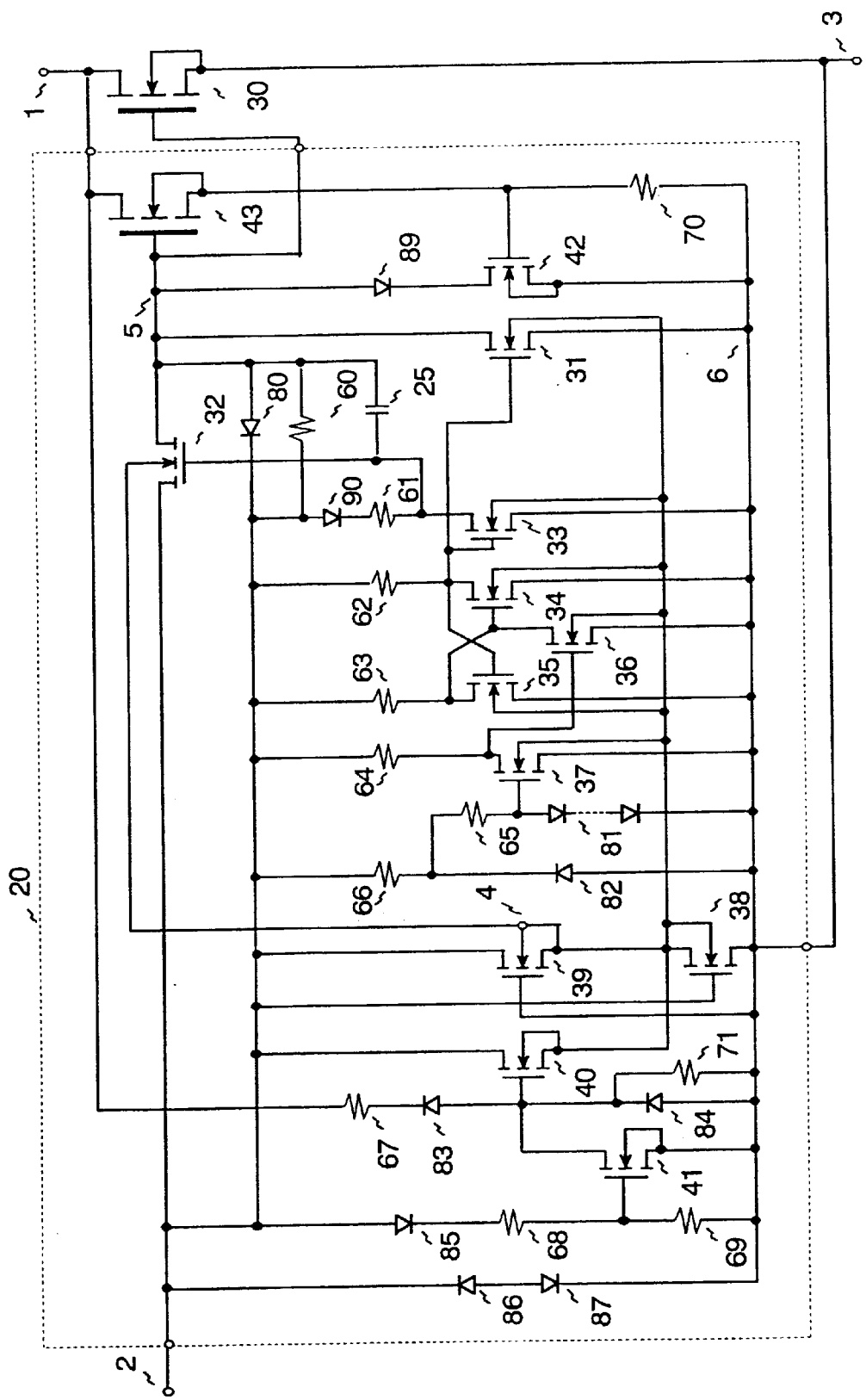
FIG. 7 is a circuit diagram showing a sixth embodiment of the insulated gate type semiconductor apparatus with a control circuit of the invention.

FIG. 7 is a circuit diagram showing a sixth embodiment of the semiconductor apparatus according to the invention. The embodiment corresponds to a case where the source terminal 3 is connected to the ground 6 shown in FIG. 1 (connection a). The switch circuits SW1 to SW3 are shown in a specific circuit construction.

In the embodiment, although the source terminal 3 is connected to the ground 6 shown in FIG. 1 (connection a), the body of each of the MOSFETs 31 and 33 to 37 is connected to the body 4 of the MOSFET 32. Consequently, the negative gate voltage is avoided by a method using the MOSFET 38 constructing the switch circuit SW3 in a manner similar to the method using the MOSFET 32 (method of short-circuiting the emitter and the base of the parasitic npn transistor) without using the diodes 88 and 91 for negative gate voltage protection used in FIG. 1 and the like in order to prevent the operation of the parasitic npn transistor existing in the MOSFETs 31 and 33 to 37. This point is similar to that of the fourth embodiment shown in FIG. 5.

In the sixth embodiment, since the sources of the MOSFETs 31 and 33 to 37 are connected to the source terminal 3, the drain current of the MOSFETs 31 and 33 to 37 does not flow in the MOSFET 38. Consequently, there is an advantage that the body 4 of the MOSFET 32 can be easily controlled without reducing the on-resistance of the MOSFET 38 (that is, without increasing the occupied area of the device on the semiconductor chip) as compared with the case of the fifth embodiment shown in FIG. 6. The sixth embodiment also has the effects of the high-speed operation, the negative gate voltage protection, and the prevention of the drain breakdown voltage drop described in the first and second embodiments. Further, there is also an effect that the operation margin of the gate voltage can be enlarged as mentioned in the fourth embodiment.

<Embodiment 7>

Figure 8:
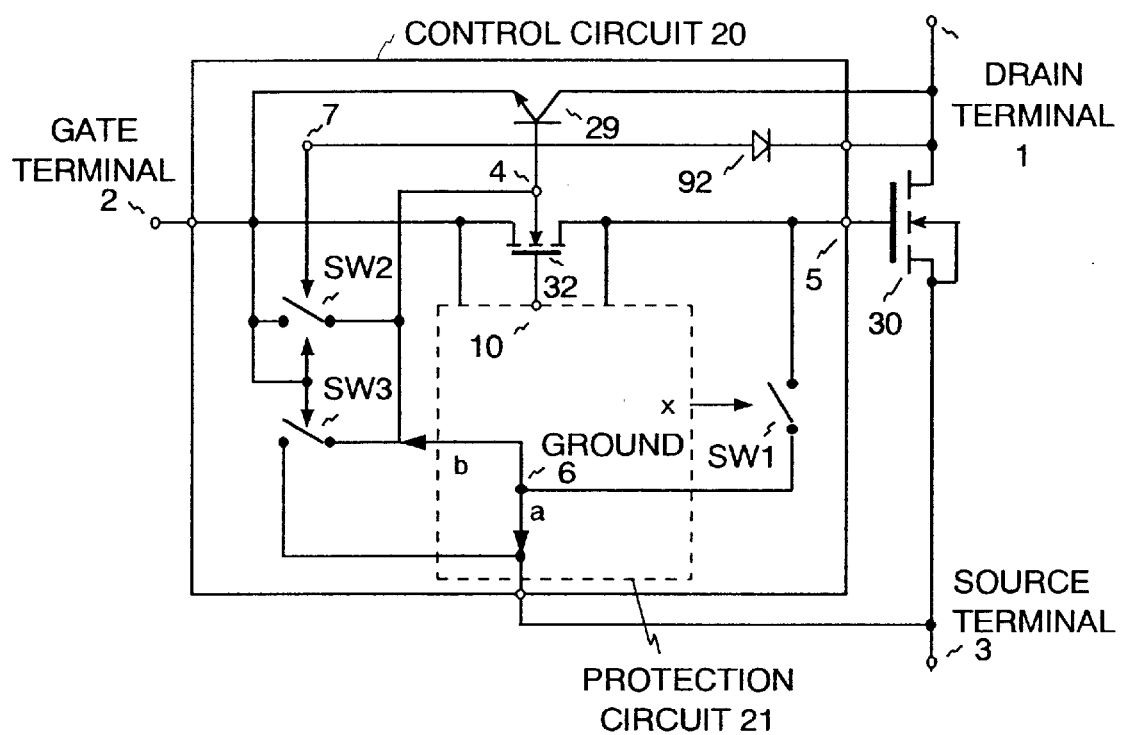
FIG. 8 is a block circuit diagram showing a seventh embodiment of the insulated gate type semiconductor apparatus with a control circuit of the invention.
Figure 9:
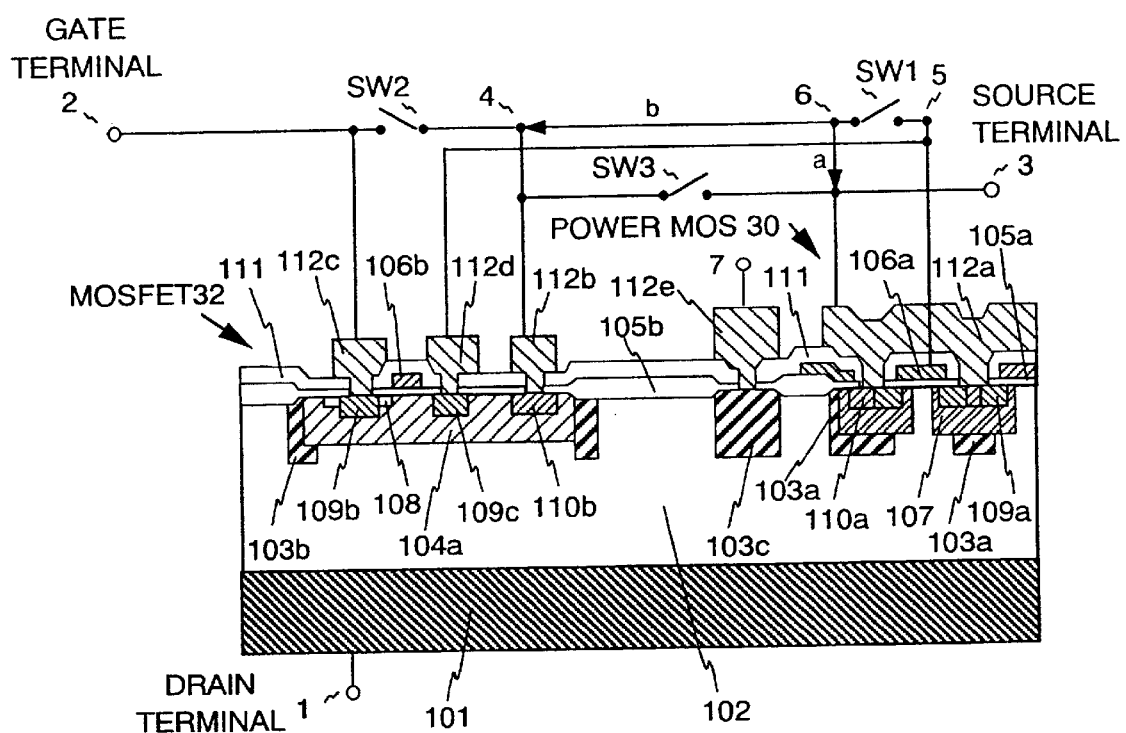
FIG. 9 is a cross section of the semiconductor apparatus according to the seventh embodiment shown in FIG. 8.

FIG. 8 is a block circuit diagram showing a seventh embodiment of the semiconductor apparatus according to the invention. The embodiment relates to a case where the switch circuit SW2 is controlled by using a node 7 of a floating p-type diffusion layer 103c as shown in the cross section of FIG. 9.

The embodiment is characterized by the construction such that a depletion layer formed between the p-type diffusion layer 103a as the body of the power MOSFET 30 and the n-type epitaxial layer 102 when a voltage of about 10V is applied to the drain terminal 1 reaches to the floating p-type diffusion layer 103c, thereby turning on the switch circuit SW2.

A parasitic diode 92 is formed between the floating node 7 and the n-type epitaxial layer 102. The breakdown voltage of the parasitic diode can be equal to the drain breakdown voltage of the MOSFET 30. When the breakdown voltage of the parasitic diode 92 is set equal to the drain breakdown voltage of the power MOSFET 30 in the embodiment, the resistor 67 provided to reduce the leakage current from the drain terminal 1 in FIG. 3 and the like is unnecessary. The seventh embodiment also can achieve the high-speed operation, the negative gate voltage protection, and the prevention of the drain breakdown voltage drop by using the low-cost process as described in the first embodiment.

<Embodiment 8>

Figure 10:
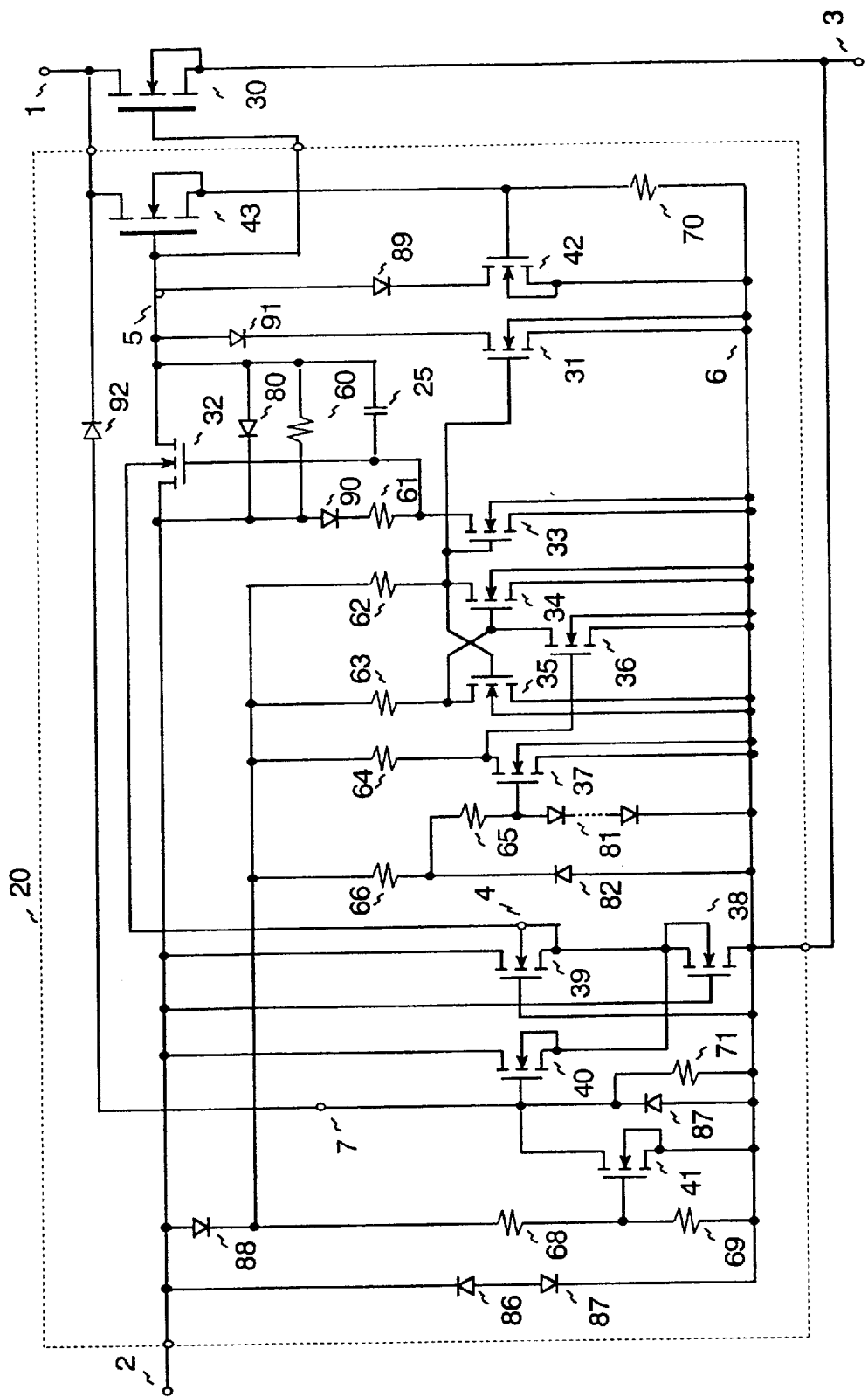
FIG. 10 is a circuit diagram showing an eighth embodiment of the insulated gate type semiconductor apparatus with a control circuit of the invention.

FIG. 10 is a circuit diagram showing an eighth embodiment of the semiconductor apparatus according to the invention. The embodiment corresponds to a case where the source terminal 3 is connected to the ground 6 shown in FIG. 8 (connection a). The switch circuits SW1 to SW3 shown in FIG. 8 are shown in a specific circuit construction. The embodiment relates to a case where the over-heating protection circuit and the over-current protection circuit are mounted as the protection circuit 21.

The embodiment has a circuit construction such that the parasitic diode 92 formed by the n-type epitaxial layer 102 and the p-type diffusion layer 103 is used in place of the polycrystalline diode 83 in FIG. 3. In the embodiment, when the breakdown voltage of the parasitic diode 92 is set equal to the drain breakdown voltage of the power MOSFET 30 as mentioned above, the resistor 67 provided to reduce the leakage current from the drain terminal 1 in FIG. 3 and the like is unnecessary.

In the eighth embodiment, as described in the seventh embodiment, since the depletion layer formed between the p-type diffusion layer 103a and the n-type epitaxial layer 102 when the drain voltage rises to, for example, 10V or higher reaches the floating p-type diffusion layer 103c, the floating node 7 has 10V (this is not due to the breakdown of the parasitic diode 92). Consequently, even when the voltages of the gate terminal 2 and the source terminal 3 are almost equal, the MOSFET 40 is turned on as in the circuit of FIG. 3, so that the voltage of the body 4 of the MOSFET 32 becomes equal to that of the gate terminal 2 and the drop of the drain-to-source breakdown voltage caused by the parasitic npn transistor can be prevented. In the eighth embodiment as well, the high-speed operation, the negative gate voltage protection, and the prevention of the drain breakdown voltage drop described in the first and second embodiments can be achieved.

<Embodiment 9>

Figure 11:
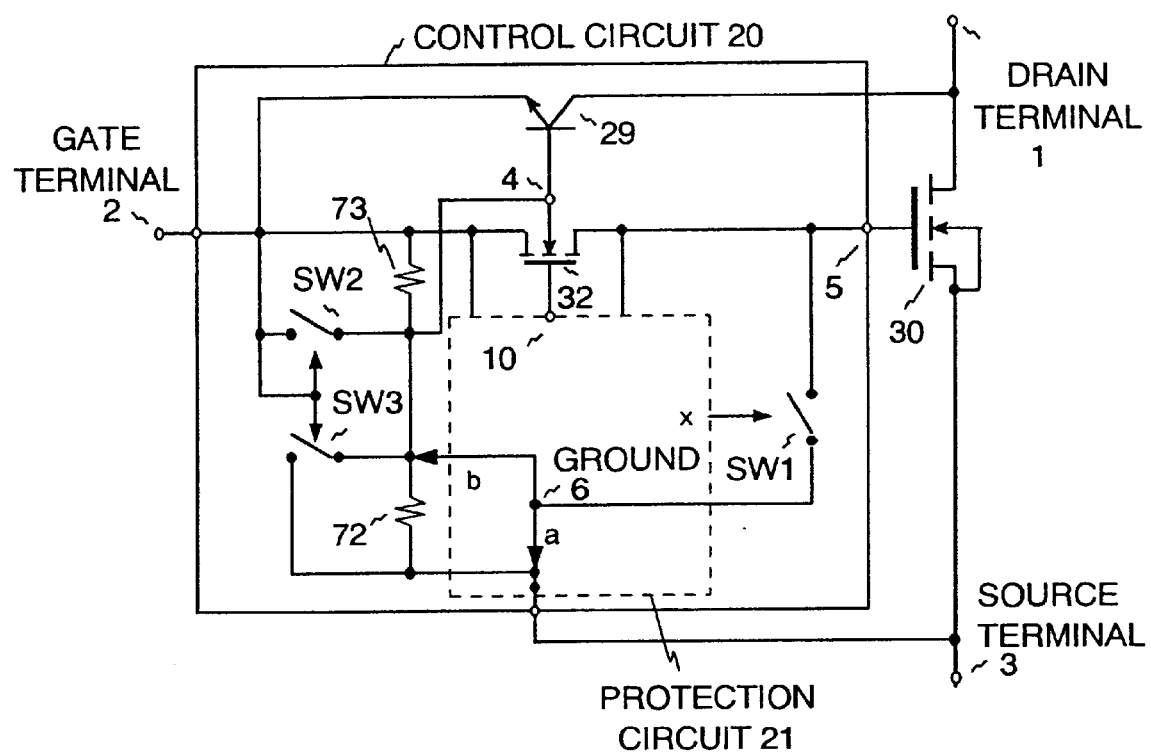
FIG. 11 is a block circuit diagram showing a ninth embodiment of the insulated gate type semiconductor apparatus with a control circuit of the invention.

FIG. 11 is a block circuit diagram showing a ninth embodiment of the semiconductor apparatus according to the invention. In the embodiment, a resistor 72 is provided in parallel to the switch circuit SW3 as a means for preventing the body of the MOSFET 32 from being floated when the voltages of the gate terminal 2 and the source terminal 3 are almost equal in the first embodiment and a resistor 73 is also provided in parallel to the switch circuit SW2, thereby preventing the drop of the drain-to-source breakdown voltage caused by the parasitic npn transistor 29.

For example, it is assumed that when the voltage of the gate terminal 2 is within ±0.7V, both of the switch circuits SW3 and SW2 cannot be turned on with the voltage supplied from the gate terminal 2. If the resistors 72 and 73 do not exist, the base voltage 4 of the npn transistor 29 is in an open state where it can fluctuate in a range of ±0.7V, so that there is a problem that the drain-to-source breakdown voltage is deteriorated by the parasitic npn transistor 29.

On the contrary, according to the invention, the resistors 72 and 73 have the same resistance value, thereby suppressing the base voltage 4 of the parasitic npn transistor 29 within ±0.35V even when the voltage of the gate terminal 2 is in a range of ±0.7V (both of the switch circuits SW3 and SW2 are in the "off" state). The drop of the drain-to-source breakdown voltage caused by the parasitic npn transistor 29 can be consequently prevented.

In the ninth embodiment, therefore, it is unnecessary to prevent that the body of the MOSFET 32 from being floated by controlling the switch circuit SW2 with the drain voltage (voltage of the terminal 1) as in the first embodiment.

<Embodiment 10>

Figure 12:
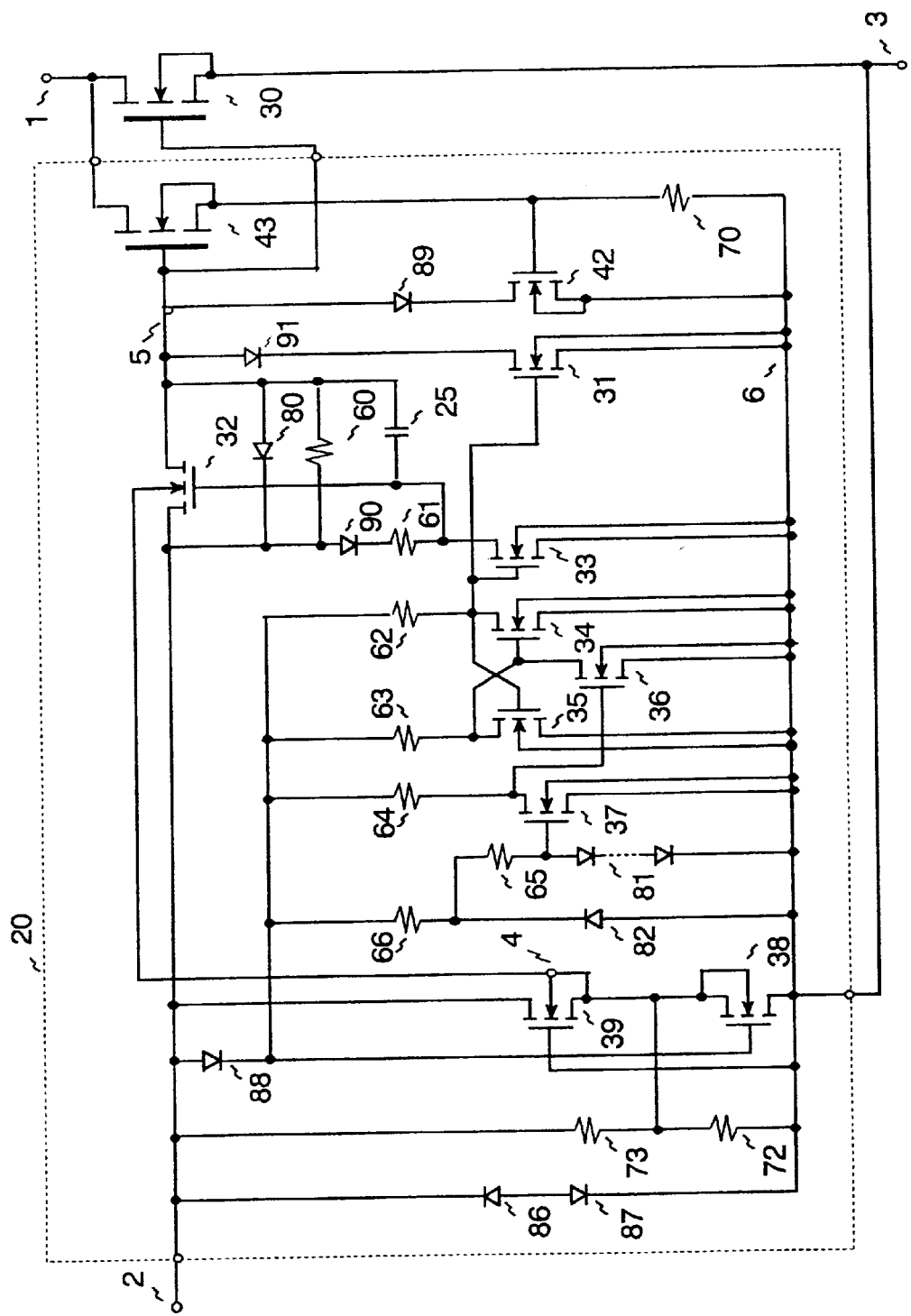
FIG. 12 is a circuit diagram showing a tenth embodiment of the insulated gate type semiconductor apparatus with a control circuit of the invention.

FIG. 12 is a circuit diagram showing a tenth embodiment of the semiconductor apparatus according to the invention. The embodiment corresponds to a case where the source terminal 3 is connected to the ground 6 shown in FIG. 11 (connection a). The switch circuits SW1 to SW3 are shown in a specific circuit construction. The embodiment relates to a case where the over-heating protection circuit and the over-current protection circuit are provided therein as the protection circuit 21.

According to the embodiment, even if the gate voltage drops nearly to zero and the MOSFET 39 operating as the switch circuit SW2 and the MOSFET 38 operating as the switch circuit SW3 are in the "off" state, by inserting, for example, resistors of 1 MΩ as the resistors 72 and 73, the drop of the drain-to-source breakdown voltage caused by the parasitic npn transistor 29 shown in FIG. 1 can be prevented.

That is, when the threshold voltage of each of the MOSFETs 39 and 38 is equal to 0.7V, the body voltage can be suppressed within a range of ±0.35V. Consequently, the drop of the drain-to-source breakdown voltage caused by the parasitic npn transistor 29 can be prevented.

Since it is unnecessary to prevent the floating of the body of the MOSFET 32 by controlling the switch circuit SW2 with the drain voltage (voltage of the terminal 1) in the embodiment, the resistors 67 to 69, and 71, the MOSFETs 40 and 41, and the diodes 83 and 84 shown in FIG. 3 are unnecessary. Instead, the resistors 72 and 73 are provided to prevent the body of the MOSFET 32 from being floated. Consequently, the tenth embodiment also can achieve the high-speed operation, the negative gate voltage protection, and the prevention of the drop of the drain breakdown voltage described in the first and second embodiments. In the embodiment, when the positive voltage is applied to the gate terminal 2 and it is unnecessary to reduce the impedance of the body 4 of the MOSFET 32 and that of the source terminal 3, the MOSFET 38 can be also removed.

When the threshold voltage of the MOSFET 39 can be set to about 0.6V or lower in the whole range of the operation temperature of the semiconductor apparatus, the resistor 73 can be removed. Similarly, when the threshold voltage of the MOSFET 38 can be set to about 0.6V or lower, the resistor 72 can be removed. There is a problem that the threshold voltages of the MOSFETs 39 and 38 have to be carefully set so as not to be too low, otherwise the gate leakage current would increase since the threshold voltages of the MOSFETs 39 and 38 decrease at a high temperature. However, in the tenth embodiment, by adding the resistors 72 and 73, the prevention of the drain breakdown voltage as an object of the invention can be achieved without decreasing the threshold voltages of the MOSFETs 39 and 38.

<Embodiment 11>

Figure 13:
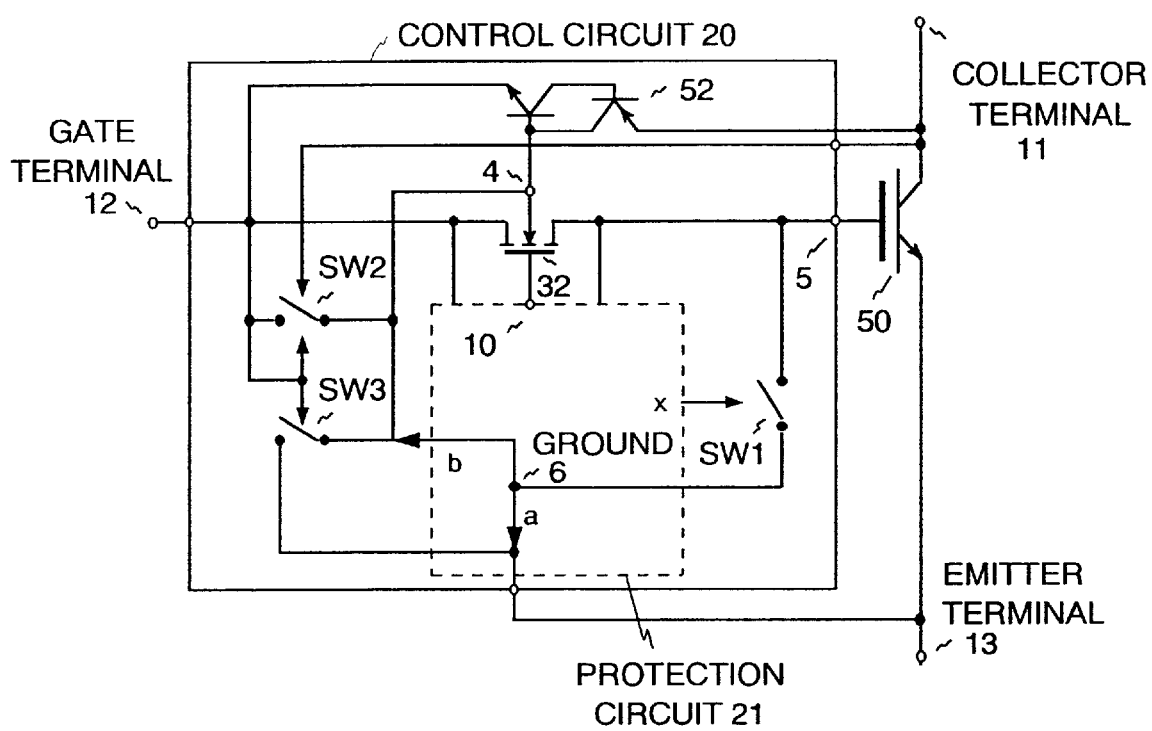
FIG. 13 is a block circuit diagram showing an eleventh embodiment of the insulated gate type semiconductor apparatus with a control circuit of the invention.

FIG. 13 is a block circuit diagram showing an eleventh embodiment of the semiconductor apparatus according to the invention. The embodiment relates to a case where an IGBT (Insulated gate bipolar transistor) is used in place of the power MOSFET 30 shown in FIG. 1.

Figure 14:
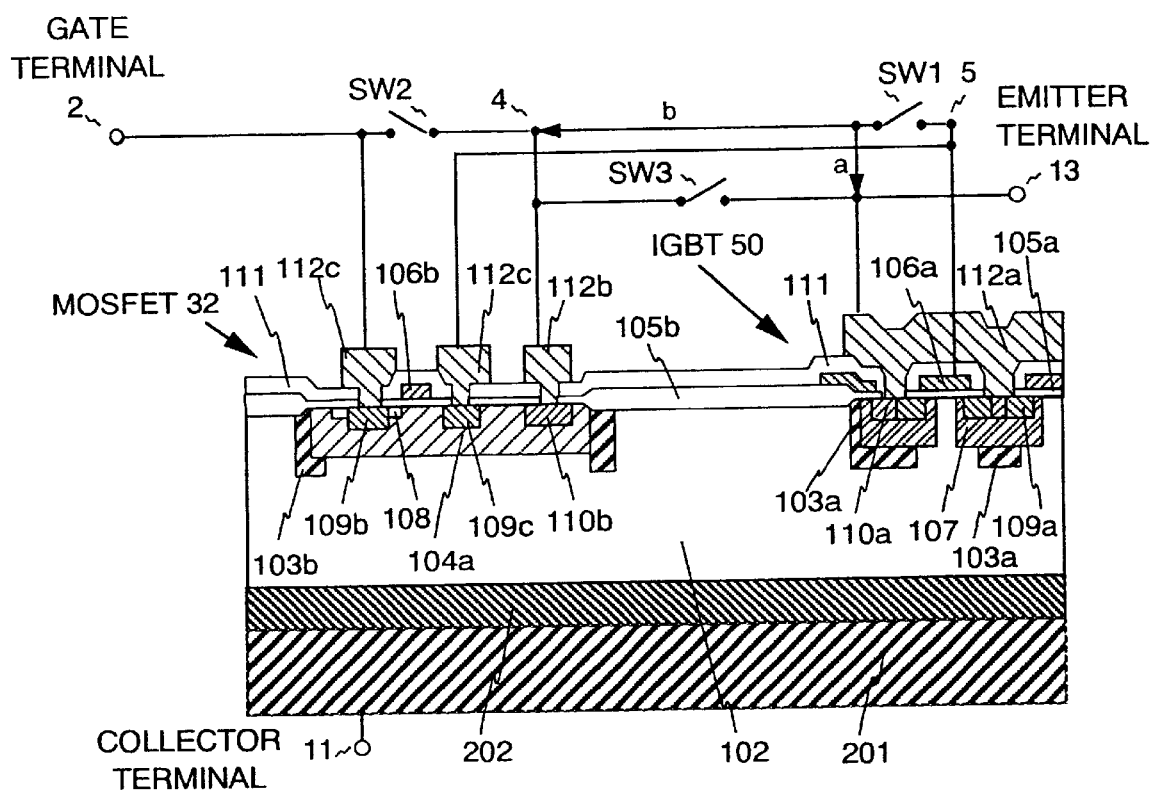
FIG. 14 is a cross section of the semiconductor apparatus according to the eleventh embodiment shown in FIG. 13.

Shown in FIG. 13 are a collector terminal 11, a gate terminal 12 and an emitter terminal 13. The MOSFET 32 is provided to perform the high-speed switching of the IGBT 50 in a manner similar to the case of FIG. 1. FIG. 14 is a cross section of the IGBT having therein the protection circuit. The different points between FIG. 14 and FIG. 2 are that a p-type substrate 201 is used as a semiconductor substrate and an n-type buffer region 202 having density higher than that of the n-type epitaxial layer 102 in order to suppress minor carrier injection from the p-type substrate 201 to the n-type epitaxial layer 102 acting as an n-type base region is formed on the p-type substrate 201.

As obviously understood from the cross section of FIG. 14, in place of the parasitic npn transistor, a parasitic thyristor 52 shown in FIG. 13 is formed between the collector terminal 11 of the IGBT 50 and the drain of the MOSFET 32 in the embodiment. It is therefore feared that when the negative voltage is applied to the gate terminal 12, the parasitic thyristor 52 is turned on and the leakage current flows from the collector terminal 11 to the gate terminal 12. That is, when the IGBT 50 is used in place of the power MOSFET 30, the problem caused by the parasitic thyristor 52 occurs in place of the problem caused by the parasitic npn transistor 29. The above-mentioned methods for the case of using the power MOSFET 30 can be also employed as the countermeasure to the problems caused by the parasitic thyristor 52.

That is, the negative gate voltage of the IGBT 50 can be avoided by controlling the body 4 of the MOSFET 32 using the switch circuits SW2 and SW3 shown in FIG. 1 in the first embodiment. Further, in a case where the base 4 of the thyristor 52 is floated when the voltage of the gate terminal 12 is close to zero, the drop of the effective collector-to-emitter breakdown voltage of the IGBT 50 by latch-up of the thyristor 52 is prevented by controlling the body 4 of the MOSFET 32 using the switch circuits SW2 and SW3 in a similar manner. The features of the semiconductor apparatus of the invention described in the first to tenth embodiments by using the power MOSFET can be achieved by using the same control circuit 20 also in the case using the IGBT. Consequently, the high-speed operation, the negative gate voltage protection, and the prevention of the drop of the collector-to-emitter breakdown voltage can be achieved.

<Embodiment 12>

Figure 15:
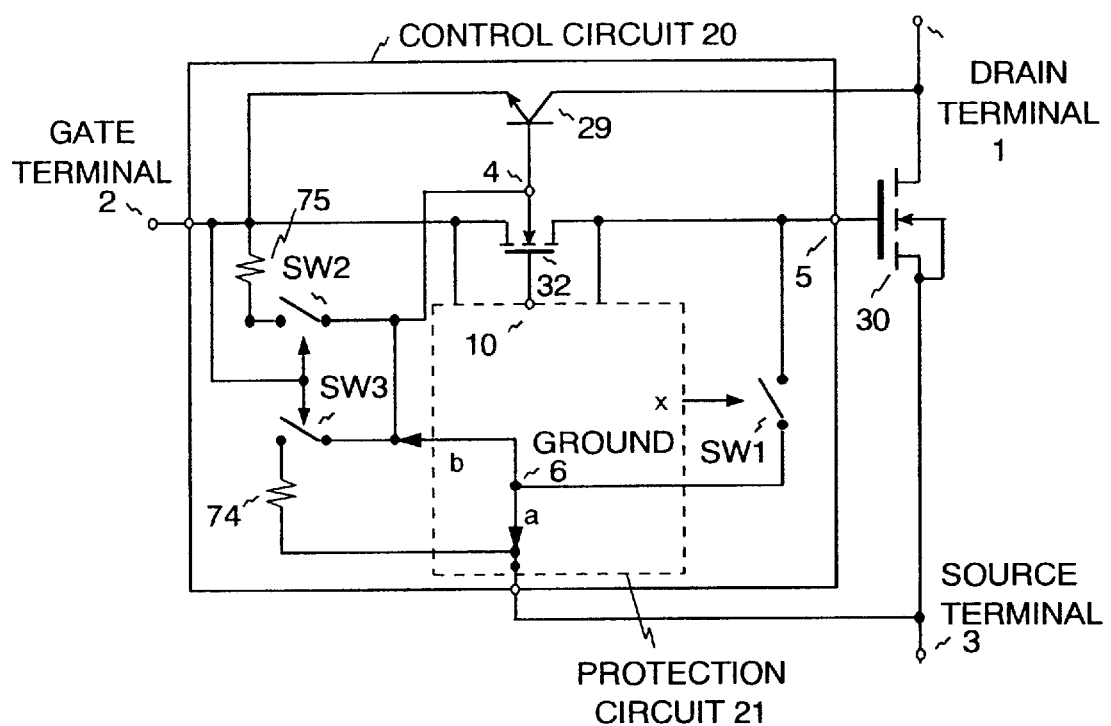
FIG. 15 is a block circuit diagram showing a twelfth embodiment of the insulated gate type semiconductor apparatus with a control circuit of the invention.

FIG. 15 is a block circuit diagram showing a twelfth embodiment of the semiconductor apparatus according to the invention. In the twelfth embodiment, as means for preventing the body of the MOSFET 32 from being floated when the voltages of the gate terminal 2 and the source terminal 3 are almost equal in the first embodiment, a resistor 74 is provided in series to the switch circuit SW3 and a resistor 75 is also provided in series to the switch circuit SW2, thereby preventing the drop of the drain-to-source breakdown voltage caused by the parasitic npn transistor 29.

The reason why the body of the MOSFET 32 is prevented from being floated by controlling the switch circuit SW2 with the drain voltage (voltage of the terminal 1) in a manner similar to the first embodiment is that the switch circuits SW2 and SW3 are not conductive when the voltage of the gate terminal 2 is close to zero. In order to make the switch circuits SW2 and SW3 conductive even if the voltage of the gate terminal 2 is close to zero, for example, it is necessary to set the threshold voltage of each of the MOSFETs constructing the switch circuits SW2 and SW3 to a value as close to zero as possible. In this case, however, there is a problem that when the temperature rises and the threshold voltage drops, the gate current flowing through the gate terminal 2 and the switch circuits SW2 and SW3 increases.

According to the embodiment, in order to make the switch circuits SW2 and SW3 conductive even when the voltages of the switch circuits SW2 and SW3 are close to zero, by setting the threshold voltage of each of the MOSFETs used for constructing the switch circuits SW2 and SW3 to a value which is as close to zero as possible or by using a depletion type MOSFET according to the case, the body 4 of the MOSFET 32 is prevented from being floated and the prevention of the drop of the drain breakdown voltage is realized. Further, the increase in the gate current passing through the switch circuits SW2 and SW3 is reduced by the resistors 74 and 75 which are provided in series to the switch circuits SW2 and SW3, respectively.

The twelfth embodiment has also the effects of the high-speed operation, the negative gate voltage protection, and the prevention of the drain breakdown voltage of the power MOSFET 30 described in the first and second embodiments.

<Embodiment 13>

Figure 16:
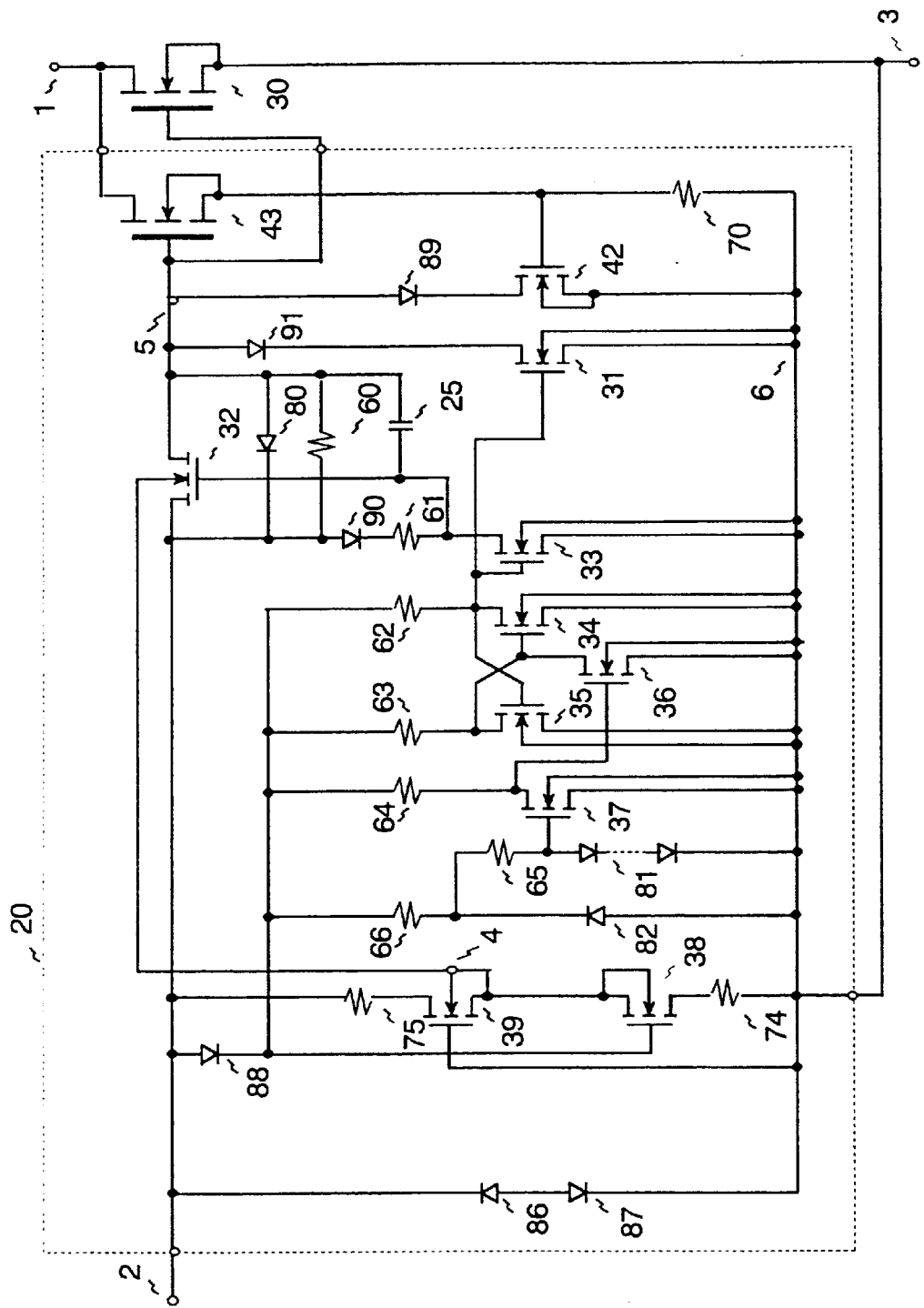
FIG. 16 is a circuit diagram showing a thirteenth embodiment of the insulated gate type semiconductor apparatus with a control circuit of the invention.

FIG. 16 is a circuit diagram showing a thirteenth embodiment of the semiconductor apparatus according to the invention. The embodiment corresponds to a case where the source terminal 3 is connected to the ground 6 shown in FIG. 15 (connection a). The switch circuits SW1 to SW3 are shown in a specific circuit construction. The embodiment relates to a case where the over-heating protection circuit and the over-current protection circuit are provided therein as the protection circuit 21.

According to the embodiment, even when the gate voltage is zero and both of the MOSFET 39 working as the switch circuit SW2 and the MOSFET 38 working as the switch circuit SW3 are in the "on" state, by inserting the resistors 72 and 73, the increase in the gate current flowing from the gate terminal 2 through the switch circuits SW2 and SW3 can be prevented.

By setting each of the threshold voltage of the MOSFET 39 working as the switch circuit SW2 and that of the MOSFET 38 working as the switch circuit SW3 to a value as close to zero as possible (or to a negative value), the drop of the drain-to-source breakdown voltage of the power MOSFET 30 can be prevented even in the case where the gate terminal 2 is close to zero.

Further, even if either the resistor 74 or 75 is not provided, depending on a choice of the threshold voltage of each of the MOSFETs 38 and 39, it can be set so that the drop of the drain breakdown voltage (breakdown voltage between the terminal 1 and terminal 3) of the semiconductor apparatus of the invention is prevented and the gate current flowing through the MOSFETs 38 and 39 is reduced.

The embodiment also has the effects of the high-speed operation, the negative gate voltage protection, and the prevention of the drain breakdown voltage drop of the power MOSFET 30 described in the first and second embodiments.

According to the invention, as obviously understood from the foregoing embodiments, the high-speed operation of the power MOSFET and the IGBT in which the control circuit such as the over-heating protection circuit and the over-current protection circuit is provided in the self-isolation structure can be realized. There are also effects such that even when the negative voltage is applied to the gate terminal, the leakage current flowing from the drain terminal (collector terminal in the IGBT) to the gate terminal caused by the operation of the parasitic npn transistor and the operation of the parasitic thyristor can be prevented and the drop of the drain-to-source breakdown voltage (collector-to-emitter breakdown voltage in the IGBT) when the voltage of the gate terminal is close to zero can be prevented.

Although the preferred embodiments of the invention have been described above, the invention is not limited to the embodiments. For example, although all of the MOSFETs including the power MOSFET and the IGBT are described as those of the n-channel type in the foregoing embodiments, similar effects can be also obtained by using p-channel type devices. It is obviously understood that various modification and changes are possible within the spirit of the invention.

We claim:

1. A semiconductor apparatus, which has a drain terminal, a gate terminal and a source terminal, comprising:

a first transistor having a drain connected to said drain terminal and a source being connected to said source terminal;

a second transistor having a source-drain path between a gate of said first transistor and said gate terminal;

a first switching circuit provided between said gate terminal and a body of said second transistor; and a second switching circuit which is provided between said source terminal and the body of said second transistor;

wherein said first switching circuit is in a ON state and said second switching circuit is in an OFF state, when said potential of said gate terminal is negative relative to said potential of said source terminal;

wherein said first switching circuit is in an OFF state and said second switching circuit is in an ON state, when said potential of said gate terminal is positive relative to said potential of said source terminal; and wherein both said first switching circuit and said second switching circuit are prevented from simultaneously being in an OFF state or in a high impedance state.

2. A semiconductor apparatus according to claim 1, wherein said first switching circuit includes a first MOSFET having a body and a source connected to a body of said second transistor, a drain connected to said gate terminal; a gate connected to a node whose potential is between a potential of said drain terminal and a potential of said source terminal.

3. A semiconductor apparatus according to claim 2, wherein said first switching circuit further includes a second MOSFET having a body and a source connected to a body of said second transistor, a drain connected to said gate terminal and a gate connected to said source terminal.

4. A semiconductor apparatus according to claim 1, wherein said first switching circuit includes a MOSFET with its body and source being connected to a body of said second transistor, its drain being connected to said gate terminal and its gate being connected to said source terminal; and a resistor between said gate terminal and said body of said second transistor.

5. A semiconductor apparatus according to claim 1, wherein said second switching circuit includes a MOSFET having a body and source connected to a body of said second transistor, a drain connected to said source termianl and a gate connected to said gate terminal.

6. A semiconductor apparatus according to claim 1, wherein said second switching circuit includes a diode having an anode connected to a body of said second transistor and a cathode connected to said source terminal.

* * * * *